United States Patent [19]

Groslambert et al.

[11] Patent Number: 4,845,692

[45] Date of Patent: Jul. 4, 1989

[54] CLOCKING DEVICE OF SUBSTANTIALLY CONSTANT STABILITY FOR SHORT-TERM AND LONG-TERM TIME MEASUREMENT

[75] Inventors: Jacques Groslambert, Besancon; Michel Brunet, Saint Orens, both of France

[73] Assignee: Centre National D'Etudes Spatiales, Paris, France

[21] Appl. No.: 182,788

[22] Filed: Apr. 18, 1988

[30] Foreign Application Priority Data

Apr. 17, 1987 [FR] France ................................. 8705525

[51] Int. Cl.$^4$ .......................... G04F 5/00; G04B 17/12; H03L 7/00
[52] U.S. Cl. .................................... 368/156; 368/200; 331/2; 331/46; 331/48; 331/175
[58] Field of Search .............................. 368/107–113, 368/155–156, 200–202; 331/2, 14, 40, 41, 46, 48, 55, 56, 175

[56] References Cited

U.S. PATENT DOCUMENTS

| | | | |
|---|---|---|---|
| 3,518,567 | 6/1970 | Helgesson | 331/55 |
| 3,594,656 | 7/1971 | Tsukamoto | 331/54 |
| 4,148,184 | 4/1979 | Akahane et al. | 33172 |
| 4,254,492 | 3/1981 | McDermott III | 368/200 |
| 4,325,036 | 4/1982 | Kuwabara | 331/48 |
| 4,583,054 | 4/1980 | Basile | 331/2 |
| 4,598,257 | 7/1986 | Southdro | 331/2 |

Primary Examiner—Vit W. Miska

[57] ABSTRACT

A clocking device of substantially constant stability for short-term and long-term measurements. This clocking device comprises first generators of a clocking signal with substantially constant stability for short-term measurements, and second generators of a clocking signal of constant stability for long-term measurements. Means for the automatic locking of one of the said first or second clocking signals to the other clocking signal are provided, and enable the automatic frequency and/or phase locking of said signals. The automatic locking means have a time constant corresponding to the transition zone between the short-term and long-term measurements. The device can be applied in the high-precision time-measuring instruments industry and to air and space navigation instruments.

17 Claims, 5 Drawing Sheets

FIG_2a

FIG.3a

FIG_3b

FIG_5

FIG. 4

CLOCKING DEVICE OF SUBSTANTIALLY CONSTANT STABILITY FOR SHORT-TERM AND LONG-TERM TIME MEASUREMENT

BACKGROUND OF THE INVENTION

1. Field of the Invention

Clocking devices currently available in time-measurement technology include a reference clock that gives a clocking signal. The choice of this signal normally depends on the field or range of measurement being considered, because the stability of the clocking signal is not homogeneous in relation to the use considered.

2. Description of the Prior Art

Figure 1:
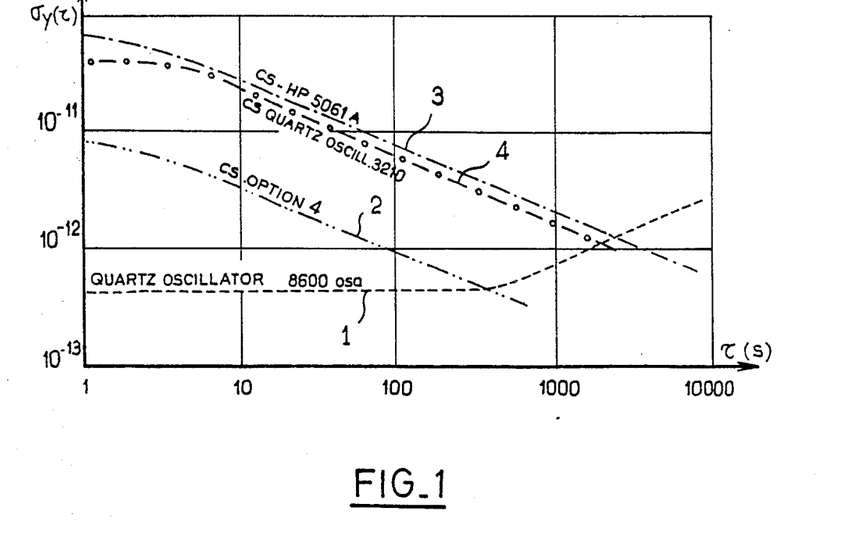
FIG. 1 relates to the frequency stability characteristics of prior art clocking devices.

Thus, referring to FIG. 1, the current state of the art can be summarized by the stability curves of the best 5 MHz frequency quartz oscillators available in the market: these are the curve ① for a quartz oscillator marketed under the name 8600 OSA by the Oscilloquartz and the curves ②, ③ and ④ respectively relating to the option 4 CS and CS-HP5061A caesium clocks, marketed by Hewlett-Packard, and the CS 3210 caesium clock marketed by Oscilloquartz. In FIG. 1, the x-axis is graduated in integration or counting time $\tau$, i.e. the measuring range, and the y-axis is graduated according to the variance of relative frequency fluctuations expressed according to Allan's variance $\delta y(\tau)$. It is observed that, for the short-term time measuring range, equivalent to a counting time $\tau$ ranging between $10^{-3}$ and 1000 s approximately, the best quartz oscillators give a frequency stability of $\delta y(\tau)$ for which the frequency variance is substantially smaller than $10^{-12}$: this variance increases very quickly and the frequency stability of the clocking signal deteriorates quickly for a counting time of more than 1000 seconds. On the contrary, the most efficient caesium clocks show a frequency variance that is far greater than $10^{-12}$: hence, the clocking signal created by these clocks has a mediocre frequency stability for a counting time of less than 100 seconds, the frequency variance becoming, by contrast, smaller than $10^{-12}$ for a counting time that is greater than about 1000 seconds.

Thus, depending on the application and the counting time envisaged, it is necessary, for measuring time under optimum conditions of precision, to use either of the clocking devices (quartz oscillator or caesium clock) and, presently, there is no single frequency reference that can cover both the short-term measuring range (counting time $10^{-3} < \tau < 1000$ s) and the long-term measuring range ($\tau > 1000$ s). The clocking device of substantially constant stability of the invention, for short-term and long-term time measurement, is aimed at removing the above-mentioned drawbacks by means of a single device, the optimum stability of which is smaller than or equal to $5 \times 10^{-13}$ for a counting time of $\tau > 1$ s.

Another object of the present invention is the application of a clocking device, used to obtain a clocking signal or reference signal having both the stability of the quartz oscillator for short-term measured counting times of less than 1000 seconds and the stability of the caesium clock for long-term measured counting times of more than 1000 seconds.

SUMMARY OF THE INVENTION

A distinguishing feature of the clocking device of substantially constant stability according to the invention, for the short-term and long-term measurement of time is that it comprises first generators of a first clocking signal with substantially constant stability for the short-term measurement of time and second generators of a second clocking signal, of substantially constant stability, for long-term measurements of time. Furthermore, means for the automatic locking of one of the said first or second clocking signals to the other, second or first, clocking signal are provided, the first and second signals having the same basic frequency or harmonic frequencies, and the automatic locking means having a time constant corresponding to the transition zone between the short-term and long-term measurements.

The clocking device of substantially constant stability according to the invention, for the measurement of time, can be applied, in the high-precision time-measuring instruments industry, to air and space navigation instruments.

BRIEF DESCRIPTION OF THE DRAWINGS

The invention will be better understood from the following description and from the following drawings in which the same references are repeated for the same elements. In these drawings:

FIG. 3b shows a timing diagram at the test points of FIG. 3a, FIG. 4 shows a flow chart of a program to control the sequential variation of the value of the time constant of automatic locking means for the first and second clocking signals to provide optimum convergence of the value of this time constant towards the final value, chosen by the operator according to the type of quartz oscillator and/or caesium clock that is actually used.

DESCRIPTION OF THE PREFERRED EMBODIMENT

Figure 2A:
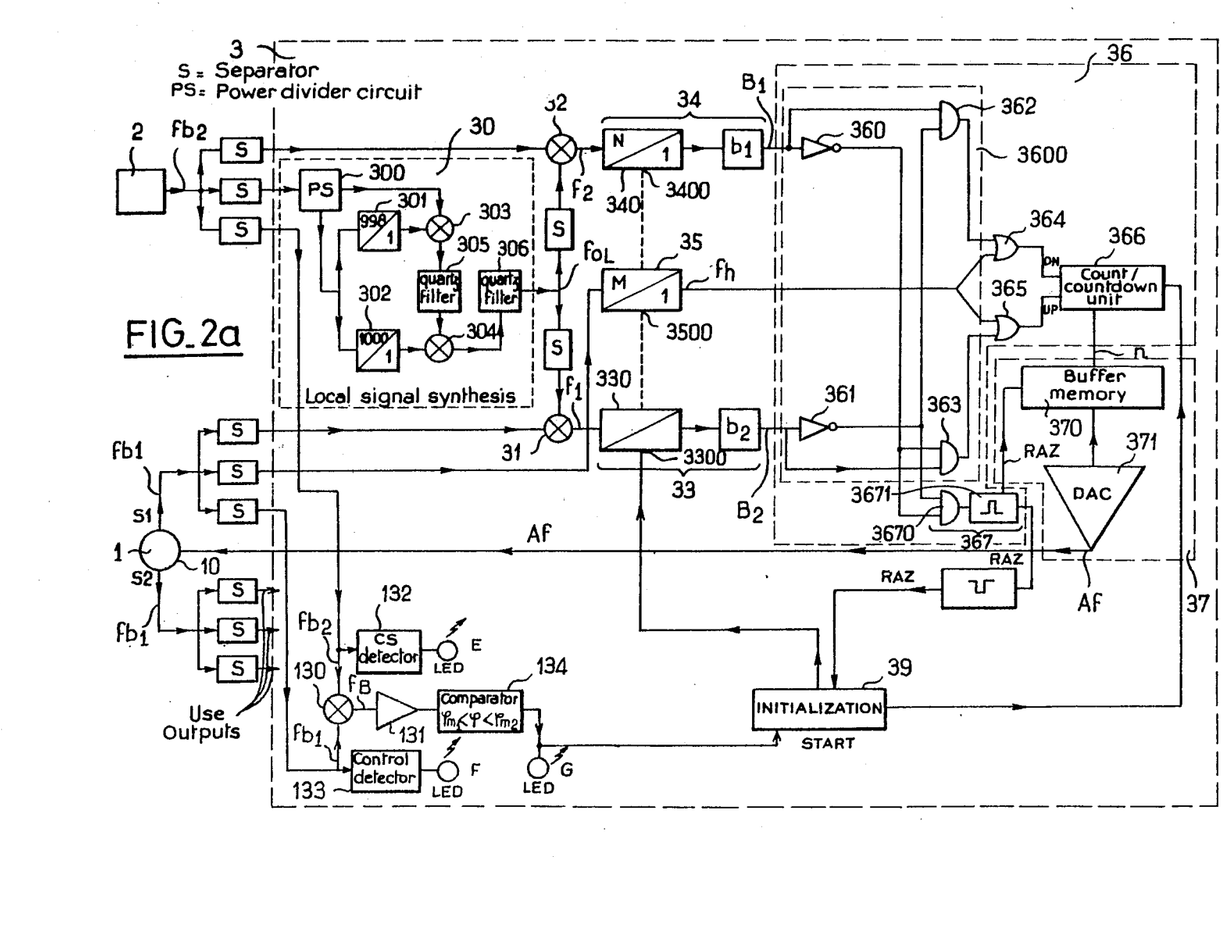
FIG. 2a shows a first general diagram of the clocking device of the invention wherein an automatic frequency locking is set up between a clocking signal and another clocking signal.

The clocking device of substantially constant stability according to the invention, used for the short-term and long-term measurement of time, shall be described first of all with reference to FIG. 2a.

As shown in the above-mentioned figure, the device of the invention has first means 1, which are generators of a first clocking signal fb1. The first generators 1 of the first clocking signal deliver a clocking signal with substantially constant stability for short-term time measurements. The term "short-term time measurements", as mentioned above, refers to time measurements where the counting times are smaller than 1000 s. The device of the invention also has second means 2, which are generators of a second clocking signal fb2, with stability that decreases, as a function of the counting time $\tau$, by $\tau^{-1}$ for long-term time measurements, said long-term time measurements being defined as those time measurements for which the counting time is greater than 1000 s.

Furthermore, as shown in FIG. 2a, means 3 are provided for the automatic locking of either the first or the second clocking signal to the other, second or first, clocking signal. The first and second clocking signals, fb1, fb2 respectively, have the same freqence, of course with the exception of fluctuations in stability, and the automatic locking means 3 show a time constant corresponding to the transition zone between the short-term and long-term measurements. Of course, the transition zone between the short-term and long-term measurements corresponds to that obtained at the intersection of the two curves giving the stability of the first generators of the first clocking signal, of substantially constant stability, for short-term time measurements and the stability of th second generators giving the second clocking signal, of substantially decreasing stability, as a function of the counting time for long-term time measurements. The automatic locking of one of the said signals, the first or second clocking signal, to the other, second or first, clocking signal, fb1, fb2, respectively, consists, as shall be described in greater detail below in the description, in an automatic frequency locking and, if necessary, an automatic phase locking of the clocking signals.

According to a particular embodiment of the clocking device of substantially constant stability, according to the present invention, for the short-term and long-term measurement of time, the first and second clocking signals, fb1, fb2, may have harmonic frequencies without going beyond the scope of the present invention. However, the preferred embodiments of the device of the invention shall be described with respect to the non-restrictive example where the frequencies of the clocking signals, fb1 and fb2, are equal apart from fluctuations in stability.

According to an especially advantageous aspect of the device of the invention, the first generators 1 of the first clocking signal are constituted by a highly stable quartz oscillator.

The quartz oscillator used may be, for example, a quartz oscillator marketed by the firm Oscilloquartz under the reference 8600 OSA. The stability curve of this quartz oscillator is given in FIG. 1.

Similarly, the second generators 2 of the second clocking signal fb2 may advantageously consist of a caesium clock, for example, the clock marketed by Hewlett-Packard under the reference CS OPTION 4. The stability curve of this caesium clock, as a function of counting time, is given by the curve 2 in FIG. 1. It would be advantageous to improve the performance of the clocks CS HP 5061 A and CS 3210 by implementing the device of the invention.

In the embodiment described in FIG. 2a, since the first generators 1 of the first clocking signal are constituted by a quartz oscillator and the second generators 2 of the second clocking signal are constituted by a caesium clock, the means 3 for the automatic locking of either the first or the second clocking signal with the other, second or first, clocking signal advantageously set up an automatic locking of the first clocking signal fb1 with the second clocking signal fb2. In this case, the first generators 1 of the first clocking signal fb1 are constituted by an adjustable frequency quartz oscillator with a control input marked 10 in FIG. 2a.

FIG. 2a shows the first generators of the first clocking signal and the second generators of the second clocking signal, comprising several outputs, which respectively deliver the first clocking signal fb1 and the second clocking signal fb2 to the automatic locking means 3 through separating stages marked S. These separating stages are separating stages normally available in the market, and shall not be described in detail herein.

A particularly advantageous embodiment of the automatic locking means 3 shall be described with reference to FIG. 2a.

According to the above-mentioned figure, the automatic locking means 3 advantageously comprise first means 31 for changing the frequency of the first clocking signal and second means 32 for changing the frequency of the second clocking signal fb2. Generators 30 of a local oscillator reference signal are used to create and deliver a local oscillator frequency signal fOL, common to the first and second frequency changing means 31 and 32. These frequency changing means 31 and 32 give a first intermediate frequency signal and a second intermediate frequency signal, with respective frequencies f1 and f2, each representing fluctuations in the phases of the first and second clocking signals, fb1 and fb2 respectively. As a non-restrictive example, the first and second generators of the first and second clocking signals, fb1 and fb2 respectively, deliver clocking signals of frequencies equal to 5 MHz for example. The local oscillator signal generators 30 deliver a signal fOL at a neighbouring frequency and the intermediate frequency signals, at frequencies f1 and f2, have a frequency close to 10 hertz. The frequency changing operation performed by the first and second frequency changing means, 31 and 32, have the effect of preserving the phase relations between the clocking signals, fb1 and fb2, at the intermediate frequency signals of frequencies f1 and f2.

The local oscillator signal generators 30 have the same stability as the second clocking signal fb2.

According to an advantageous, non-restrictive embodiment shown in FIG. 2a, the local oscillator reference signal generators 30 are used to create this signal from the 5 MHz clocking signal fb2 of the caesium clock constituting the second generators 2 of the second clocking signal fb2. The local frequency signal fOL is created by synthesis from the second clocking signal fb2. For this purpose, the local oscillator signal generators 30 may advantageously comprise a power divider circuit 300 or a hybrid T-junction circuit used to subdivide the clocking signal fb2 into two identical signals, of the same power, in order to power the synthesizer circuits. Advantageously, the synthesizer may have a first frequency divider 301 and a second frequency divider 302, and two mixing circuits 303 and 304 which receive the signals delivered by the divider circuits 301 and 302. The first mixing or frequency changing circuit 303 also receives one of the signals delivered by the power divider circuit 300 and delivers the signal obtained by frequency change to the input of the second frequency change circuit 304 through a filter 305. The output of the second frequency change circuit 304 then gives the local oscillator reference signal fOL through a quartz filter 306. The local oscillator frequency signal fOL is then delivered through a separator stage S to the inputs of the frequency change circuits 31 and 32. The first and second frequency divider circuits, 301 and 302, having division ratios respectively equal to 998 and 1000, the frequency fOL of the local oscillator signal verifies the relationship:

fOL=fb2+10 Hz.

The automatic locking of the signal fb1 with the signal fb2 is based, according to the diagram of FIG. 2, on the temporal measurement of the duration of N beats. These N beats are obtained, firstly, between the frequency fOL of the local oscillator signal and the clocking signal fb2. This signal fb2 is thus a reference which has the stability corresponding to the long-term stability of the generators 2 of the second clocking signal. The N beats are obtained, secondly, between the frequency fOL and the clocking signal fb1, or first clocking signal, delivered by the generators 1 of the first clocking signal. The beat signals thus obtained, or intermediate frequency signals, are respectively marked f2 and f1.

According to the invention, the automatic locking is thus achieved by integration of the phase fluctuations of the clocking signal, fb2, delivered by the caesium clock constituting the second generators of the clocking signal, fb2, for a period $\tau$ equal to N/f2.

To this end, the automatic locking means 3, shown in FIG. 2a, have first means 33 and second means 34 for counting a number N of periods of the first and second intermediate frequency signals, of frequencies f1, f2 respectively. As shown in FIG. 2a, the first and second means, 33 and 34, for counting the number N of periods of the first and second intermediate frequencies, f1, f2 respectively, may advantageously comprise the following respectively: a programmable divider 330, 340, and a flip-flop marked b2 and b1 respectively. Of course, the programmable dividers, 330 and 340, are identical and their dividing ratio is programmable from 1 to N as shall be described hereinafter. The respective flip-flops, b2, b1, are triggered at the start of the counting operation and remain at the state 1 during the N counted periods of the intermediate frequency signals, at frequencies f2, f1. The flip-flops, b1 and b2, respectively deliver signals B1 and B2. These flip-flops thus give logic signals, b1, b2 respectively, which represent the counting of N periods of the first intermediate frequency signal and the second intermediate frequency signal, of frequencies f2 and f1 respectively.

Furthermore, as shall be noted in FIG. 2a, the automatic locking means also comprise generators 35 of a frequency fh clock signal, the frequency of which is a harmonic of the frequency of the first clocking signal fb1. The generators 35 of the frequency fh clock signal may advantageously consist of a programmable divider which divides the frequency of the signal delivered by the first generators of the first clocking signal, fb1, in a given programmable ratio M.

Furthermore, the automatic locking means 3 also have count/countdown means 36, used to establish a value n from the logic signals, B1 and B2, delivered by the flip-flops, b1 and b2, this value representing the frequency deviation between the first intermediate frequency signal with the frequency f1 and the second intermediate frequency signal with the frequency f2, the counting or countdown of the value of n being done with reference to the frequency fh clock signal.

To this end, the count/countdown means 36, receiving the logic signals, B1 and B2, given by the flip-flop b2 of the counting means 33 and the flip-flop b1 of the counting means 34, may advantageously include, at a first input, receiving the logic signals B1, an inverter 360 and an AND gate 362, one input of which receives the above-mentioned logic signals B1, and at a second input, receiving the logic signals B2, an inverter 361 and an AND gate 363, one input of which receives the above-mentioned logic signals B2. Furthermore, the count/countdown means also have two OR gates, 354 and 365: one input of the above-mentioned OR gates receives the frequency fh clock signal, the other input of the OR gate 364 receives the signals delivered by the output of the AND gate 362, and the other input of the OR gate 365 receives the signals delivered by the output of the AND gate 363. The circuit constituted by the inverters, 360, 361, and the AND gates, 362, 363, are used to constitute a logic circuit 3600 enabling the preparation of the logic signals and B1.$\overline{B2}$ and B2.$\overline{B1}$, which are logic products of the signals B1 and B2 and $\overline{B2}$ and $\overline{B1}$ respectively.

A count/countdown unit 366 receives the logic signal delivered by the second OR gate 365 at the counter input and the signal delivered by the first OR gate 364 and the countdown input.

Similarly, as will be seen in FIG. 2a, the automatic locking means 3 and, especially, the count/countdown means 366 also have a circuit 367 that generates pulses at the end of the counting of N periods and gives, at the end of the counting of the above-mentioned N periods of the first and second intermediate frequency signals, at frequencies f1 and f2, a re-initializing or zero-setting pulse RAZ. The function of the re-initializing pulse or zero-setting pulse RAZ shall be described further below in the description.

Finally, as shown in FIG. 2a, the automatic locking means 3 also have generators 37 of an analog signal Af, representing the frequency and phase deviation between the first and second intermediate frequency signals of frequencies f1 and f2. The generators 37 give the analog signal Af to the control input 10 of the adjustable frequency quartz oscillator. Advantageously, the generators 37 of the analog signal Af may consist of a buffer memory 370, which receives the digital signal delivered by the count/countdown unit 366, and a digital-analog converter 371.

The working of the automatic locking means 3, described above with reference to FIG. 2a, shall now be described with reference to FIG. 2b.

The count/countdown unit 366, which acts as an accumulator, is pre-positioned at its mid-capacity, the most significant bit being positioned at the value 1 and the other bits at the value 0. The count/countdown unit 366 receives the frequency fh clock signal, and performs counting and countdown operations depending on the state of the flip-flops b1 and b2.

Figure 2B:
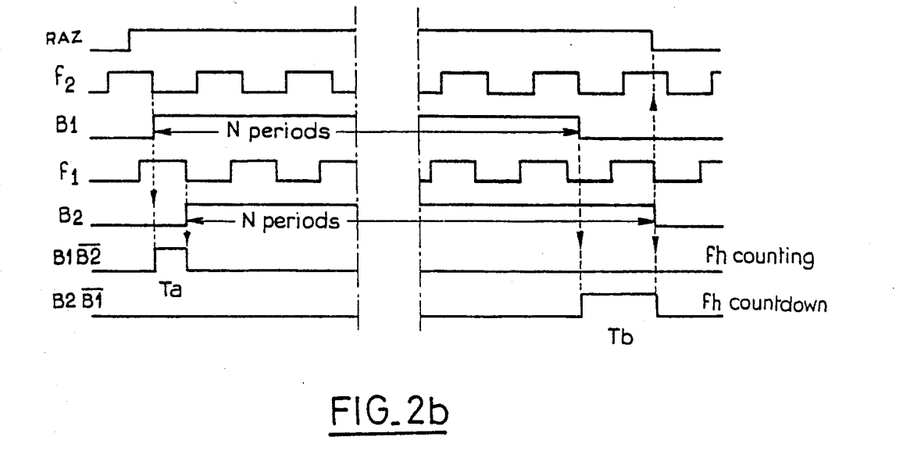
FIG. 2b shows a timing diagram of the signals at the test points corresponding to FIG. 2a, FIG. 3a shows an advantageous embodiment of the clocking device of the invention, shown in FIG. 2, wherein a automatic phase locking is set up between the first and second clocking signals.

To understand the working of the automatic locking system shown in FIG. 2a, it might be useful to refer to the timing diagram of the signals shown in FIG. 2b. FIG. 2b shows a working of the device as shown in FIG. 2a, where the automatic locking is an automatic frequency locking. FIG. 2b respectively and successively shows the zero-setting signal delivered by the pulse-generating circuit 367, the signal f2, which is the intermediate frequency signal delivered by the second frequency changing means 32, the signal B1 delivered by the flip-flop b1 of the counting means 34, the intermediate frequency f1 signal delivered by the first frequency changing means 31 and the signal B2 delivered by the flip-flop b2 of the first counting means 33. The logic product of the signals, B1.$\overline{B2}$ and B2.$\overline{B1}$, is also shown in FIG. 2b. When these signals are in the logic state 1, namely during a period Ta for the logic signal B1.$\overline{B2}$ and a period Tb for the logic signal B2.$\overline{B1}$, they are respectively used to trigger the counting operation and then the countdown operation of the count/countdown unit 366.

The first clocking signal fb1 is automatically linked, in frequency, to the second clocking signal fb2 when the duration Ta is equal to the duration Tb, the intermediate frequency signals, at frequencies f1 and f2, having the same phase deviation as the clocking signals, fb1 and fb2, and capable of being at any phase. The automatic locking that is thus set up, as shown in FIG. 2a, is an automatic locking in frequency.

Furthermore, the automatic locking means also have an initialization circuit 39, the functioning mode of which shall be described further below in the description. Among other functions, this initialization circuit provides for setting the value of the programmable dividers 330, 340 and 35 for example. The circuit 367 for generating pulses at the end of the counting is used, after the final tally of the N periods of the intermediate frequencies f1 and f2 signals, to refresh the value of the parameter n, representing the frequency deviation between the first intermediate frequency f1 signal and the second intermediate frequency f2 signal, by registering the value of this parameter in the buffer memory 370 and triggering the digital-to-analog conversion at 371.

Figure 3A:
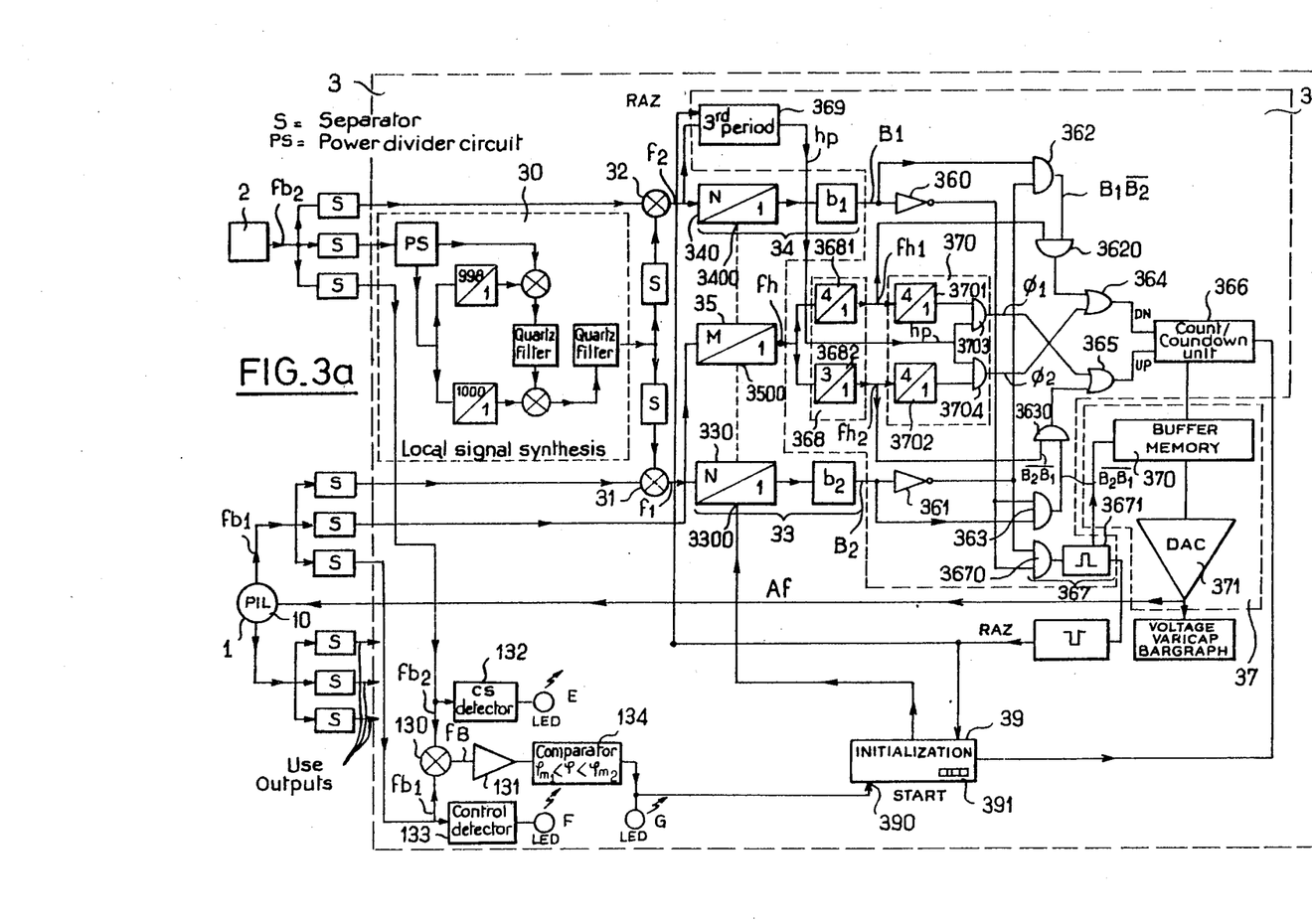

A more especially advantageous embodiment of the automatic locking means 3 of the device of the invention shall be described in relation to FIG. 3a for an example where the automatic locking means are used to provide automatic frequency locking and phase locking of the clocking signal fb1 with the clocking signal fb2. In FIG. 3a, the same references represent the same elements as in FIG. 2a.

To set up the above-mentioned automatic phase locking, the count/countdown means 36 further have a frequency fh clock signal duplicating circuit 38 used to create a first duplicated clock signal fh1 and a second duplicated clock signal fh2, at a different frequencies. The circuit 368, as shown in FIG. 3a, may advantageously comprise a first frequency divider circuit 3681, used to create the clock signal fh1 and a second frequency divider circuit 3682, used to create the clock signal fh2. The clock signals, fh1 and fh2, created from the above-described frequency fh clock signal, have different frequencies. As a non-restrictive example, the frequency divider circuit 3681 is a divider by four and the frequency divider circuit 3682 is a divider by three.

Furthermore, as shown in FIG. 3a, the count/countdown means 36 also have means 369 for discriminating a period, among p periods, of the second intermediate frequency f2 signal. In the embodiment described in FIG. 3a, the means for discriminating a period among p periods can be used, in fact, to discriminate a period among the first three periods and are constituted by a flip-flop type circuit used to create a logic signal hp, with a constant logic state, throughout the duration of the $p^{th}$ period thus discriminated, i.e. the third period in the special example of FIG. 3a.

As is also shown in FIG. 3a, the count/countdown means 36 also include means 370 for counting a number N$\phi$ of periods of each of the first and second duplicated clock signals, fh1 and fh2, during the above-mentioned $p^{th}$ period, namely the third period, this counting being done so as to give a first and second phase-setting signal, $\phi$1 and $\phi$2. According to the embodiment of FIG. 3a, the counting means 370 advantageously have a first frequency divider 3701, receiving the duplicated clock signal fh1, the frequency divider circuit being constituted, in the embodiment of FIG. 3a, by a divider by four. The counting means 370 also include a second frequency divider 3702 receiving the duplicated clock signal fh2, this second frequency divider 3702 constituting frequency divider by four. Two AND circuits, 3703 and 3704, respectively receive the divided frequency signal delivered by the frequency divider 3701 and the divided frequency signal delivered by the frequency divider 3702, each AND circuit also receiving, in common, the logic signal hp with a determined state, delivered by the means 369 for discriminating a period among p. The outputs of the AND circuits, 3703 and 3704, then respectively give a first and second phase-setting signal, $\phi$1 and $\phi$2, the phase-setting signal $\phi$1 being delivered to the input of the second AND gate 365 and the phase-setting signals $\phi$2 being delivered at the input of the first OR gate 354.

The use of two different clock frequencies, the duplicated clock frequencies, fh1 and fh2, respectively equal to fh/4 and fh/3 as described above, makes it possible to achieve the automatic locking, in phase, of the first clocking frequency signal fb1 with the second clocking signal fb2, as shall be described with reference to FIGS. 3b.

Figure 3B:
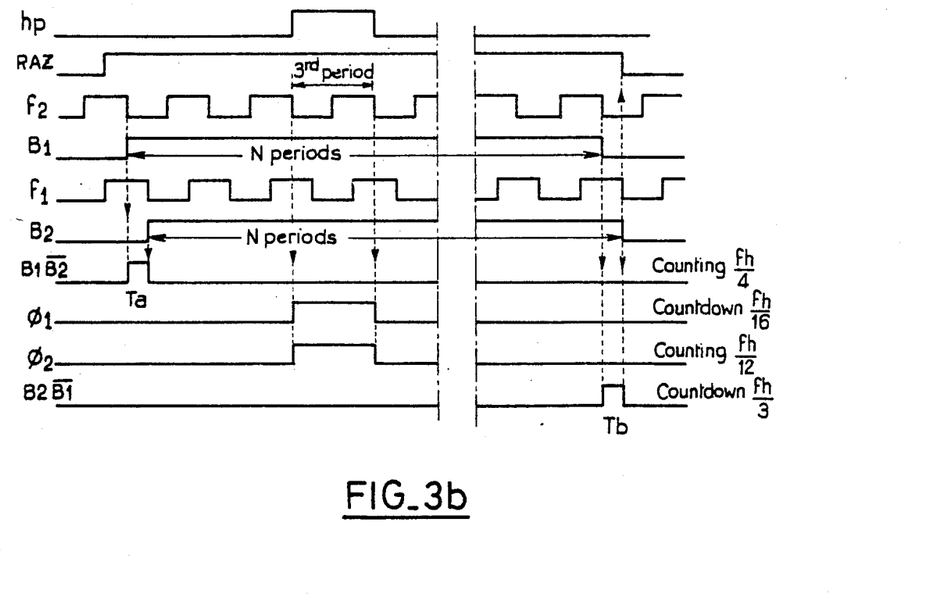

FIG. 3b successively shows the signal hp for discriminating a period, namely the third period of the intermediate frequency f2 signal, the zero-setting signal RAZ, the intermediate frequency f2 signal delivered by the second frequency changing means 32, the signal B1 delivered by the flip-flop b1 of the counting means 34, the intermediate frequency f1 signal delivered by the first mixing means 31, the signal B2 delivered by the flip-flop b2 of the first counting means 33, the logic signal B1.$\overline{B2}$ delivered by the AND gate 362 and then again, successively, the phase-setting signal o1 given by the AND gate 3703 which corresponds to a frequency fh/16 signal to command countdown during the third period of the intermediate frequency f2 signal, namely during the logic state 1 or top state of the signal hp, and the phase-setting signal o2 which corresponds to a frequency fh/12 count command delivered by the output of the AND gate 3704 during the third period of the intermediate frequency f2 signal represented by the signal hp, and then finally the signal B2.$\overline{B1}$.

In FIG. 3b, the signal B1.$\overline{B2}$ corresponds to a counting command of the count/countdown means 366 at the frequency fh/4 for the duration Ta, the signal o1 corresponds to a countdown by the same count/countdown means 366 at the frequency fh/16, during the third period, the phase-setting signal o2 corresponds to a count by the count/countdown means 366 at the frequency fh/12 during this same third period of the intermediate frequency f2 signal, and the signal B2.B1 corresponds to a countdown of the count/countdown means 366 for a duration of Tb at the frequency fh/3.

As can be also seen in FIG. 3a, in order to enable the count/countdown means 366 to perform the above-mentioned counting and countdown operations upon command by the signals B1.B2, $\phi$1, $\phi$2, B2.B1, the count/countdown means 36 respectively have two additional AND gates, 3620 and 3630, the inputs of which receive the signal B1.B2 and the signal fh1, namely the duplicated clock signal, the signal B2.B1 and the signal fh2, namely the other duplicated clock signal. The outputs of the AND gates, 3620 and 3630, are respectively connected to an input of the OR gates, 364 and 365 respectively, the other input of the OR gates, 364 and 365, receiving the outputs of the AND gates 3704 and 3703, respectively delivering the above-described phase-setting signals o2 and o1. Of course, as earlier, the outputs of the OR gates 364 and 365 are connected to the countdown and counting inputs respectively of the count/countdown means 366.

In the example of the status diagram of FIG. 3a, as shown in FIG. 3b, the automatic frequency locking and phase locking between the first clocking signal fb1 and the second clocking signal fb2, is done when the periods Ta and Tb of the signals B1.B2 and B2.B1 verify the relationships:

$$Ta \times \frac{fh}{4} = Tb \times \frac{fh}{3}$$

A first approach in which Ta equals 4/3 of Tb is an unstable approach and a second approach where Ta equals Tb equals 0 is also an approach where the clocking signals fb1 and fb2 are in phase, this approach being also unstable. For, a slight phase delay ε on one of the signals appears as an apparent deviation of 360° − ε, which de-links the automatic locking.

To remove the above-mentioned drawback, the device of the invention as shown in FIG. 3a provides for a automatic locking in phase at 90°. In this case, advantageously, the durations Ta and Tb of the signals B1.B2 and B2.B1 are taken to be equal to a quarter of the period of the second intermediate frequency f2 signal, these durations verifying the relationship:

Ta = Tb = T/4.

In this case, the counting and countdown operations are done at two different frequencies, fh/4 and fh/3 respectively, during the periods T2 and T1 where T2 and T1 each represent the period of the intermediate frequency signals, namely the second intermediate frequency f2 signal and the first intermediate frequency f1 signal. At phase quadrature, the result of the count/countdown unit 366 which plays the role of an accumulator is then:

$$\frac{fh}{4} \times \frac{T2}{4} - \frac{fh}{3} \times \frac{T2}{4}.$$

For the counting result of the count/countdown unit to be unchanged, it then suffices to count and count down the frequency fh/4 and fh/3 signals during a period T2/4. When there is no period T/4 signal, since there is a period T2 signal, it is enough to count and count down frequencies that are four times lower, namely fh/16 and fh/12, during the period T2.

The period chosen to perform the above-mentioned counting is the third period of T2, namely the third period of the second intermediate frequency f2 signal so that there is no overlapping with the signals B1.B2 or B2.B1.

The clocking frequency signal fb1, namely the first clocking signal, is then automatically locked in phase quadrature with the clocking signal fb2, namely the second clocking signal, when the following relationship is verified:

$$Ta \times \frac{fh}{4} - Tb \times \frac{fh}{3} + T2 \times \frac{fh}{12} - T2 \times \frac{fh}{16} = 0$$

that is, for $$Ta = Tb = \frac{T2}{4}$$

The capture range of a automatically phase locked system is inversely proportionate to the time constant of the automatic locking device. It becomes very small, about $2 \times 10^{-10}$ in terms of relative value for a high time constant close to 1000 s. A similar type of system, namely one with a pre-set time constant, therefore cannot meet the locking and holding conditions in the usual operating conditions of the device of the invention to which, precisely, the time constant should be adapted as a function of the measuring or counting time.

To cope with the above-mentioned difficulty, the device of the invention provides for the application of automatic locking means with a sequentially variable time constant. Thus, the automatic locking is done, first of all, on a low time constant of about 25 s and, then this time constant is gradually doubled each time that the automatic locking of the system in frequency and phase is done to reach the value closest to the one sought. Of course, the final time constant is chosen by the user through a system for the pre-selection of the said constant. This is the system that shall be described further below in the description.

As will be noted in FIGS. 2a and 3a in particular, in order to enable the implementation of sequentially variable time constant automatic locking means, the first and second counting means, 33 and 34 respectively, and the clock signal fh generators 35 have a programmable frequency divider, the respective input gates, 3300, 3400 and 3500 respectively, of which are connected to a control circuit, namely the above-described initializing circuit 39.

According to an especially advantageous aspect of the device of the invention, in order to provide for the control of the time constant of the automatic locking means 3 according to a determined sequence variation, the control circuit 39 is constituted by a wired logic control logic circuit or a microprocessor.

As is further shown in FIGS. 2a and 3a, to provide for the control of the time constant of the automatic locking means 3 according to a determined variation sequence, the automatic locking means 3 further include third frequency changing means 130 which receive, firstly, the first and second clocking signals, fb1 and fb2, to give a beat signal fB, the amplitude of which is proportionate to the phase φ of the first signal fb1 with respect to the second clocking signal fb2, said signals being automatically locked in frequency. Amplifiers 131 are further provided so that an amplified beat signal fB can be obtained.

Furthermore, as will be seen in FIG. 3a, comparators 134 with two phase value thresholds, φm1 and φm2, are provided. These comparators 134 deliver a two-state logic signal, a first stage corresponding to a phase value φ ranging between the phase threshold values, φm1 and φm2, and a second state complemented with respect to the first state, corresponding to a phase value φ external to the phase interval defined by the phase threshold values, φm1 and φm2. The logic signal delivered by the comparator 134 is delivered to an input gate 390 of the control or initializing circuit 39 so as to enable an automatic locking of the phase value $\phi$ between the two phase threshold values, $\phi m1$ and $\phi m2$. In FIG. 3a, it will also be noted that certain ancillary devices have been provided. These ancillary devices may consist, for example, of a detector 132, used to detect the presence of the clocking signal fb2, with which is associated a light-emitting diode used to indicate the presence of the clocking signal fb2, and a detector 133 used to detect the presence of the signal fb1, with which is associated the corresponding light-emitting diode, used to indicate the presence of the clocking signal fb1. Similarly, the comparator or its output, connected to the input gate 390 of the initializing or control circuit 39, may be provided with an indicator light-emitting diode used to indicate the automatic phase locking.

According to an advantageous feature of the device of the invention, shown in FIG. 3a, the control circuit 39 has a system 391 for the encoding, by the operator using the device, of the final value if of the final time constant of the automatic locking means 3. The encoding means 391 may consist, for example, of an encoding wheel used to indicate a figure D, ranging between 0 and 7 for example, the final time constant $\tau f$ being then defined by the value $\tau f = 25 \times 2^D$s.

The control circuit 39, provided with its microprocessor or wired logic circuit, uses the initial phase shift value $\phi i$ between the first and second clocking signals, fb1 and fb2, to obtain an optimal convergence of the locking in of the automatic locking means 3 through sequential modification of the value of the time constant $\tau j$ to reach the final value if, the phase shift value $\phi$ being maintained in the interval defined by the phase threshold values $\phi m1$ and $\phi m2$.

Figure 4:
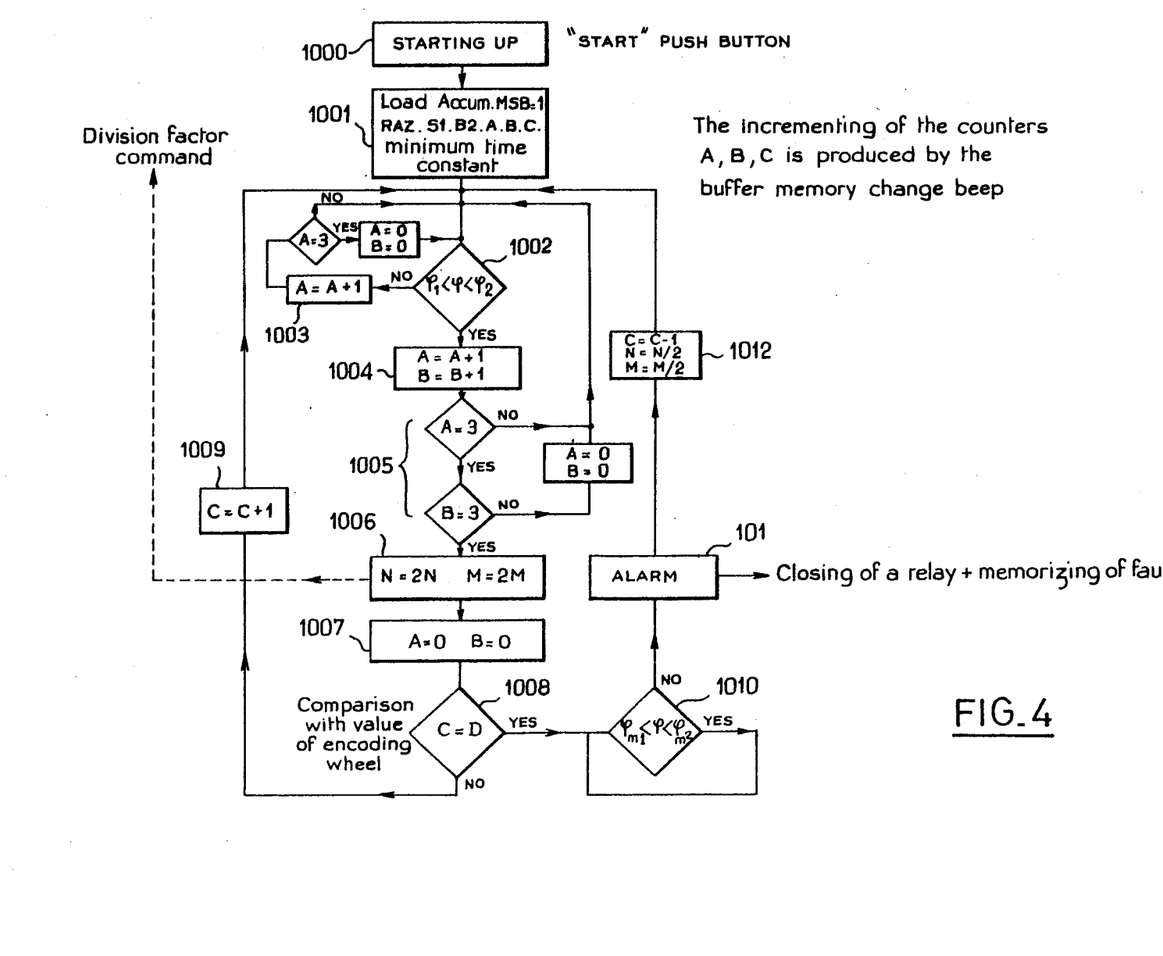

An example of a more especially advantageous embodiment of the control device or circuit 39, when it consists of a microprocessor, shall be given with reference to FIG. 4.

In the example of the above-mentioned figure, the microprocessor has an associated read-only memory in which there is implanted a program to control the sequential variation of the division ratio N of the first counting means 33 and second counting means 34 for counting a number N of periods of the first and second intermediate frequencies, f1 and f2 respectively, and of the division ratio M of the clock signal fh generators 35. According to the above-mentioned figure, the program has a starting-up stage 1000 and an initializing stage 1001 triggered by the operator when the device is turned by means of the control device 39. During the above-mentioned steps 1000 and 1001, the device is initialized by a "start" push button, namely the counters are set at zero, the programmable dividers are pre-positioned on the corresponding values N and M and the count/countdown unit 366 is positioned at the middle of its total capacity, the most significant bit being positioned at 1 and the other bits being positioned at 0. The value of the count/countdown unit 366 is then transferred to the memory 370, this value being then applied through the digital-to-analog converter DAC 371 to the control input 10 of the quartz oscillator constituting the first means used to create the clocking signal fb1. This input is then biased at voltage close to 5 volts. Keeping the "start" pushbutton pressed down blocks the system while, at the same time, applying this maximum voltage at the control input 10. This makes it possible to mechanically set the frequency matching of the quartz oscillator to bring it closer to the frequency of the caesium clock, the second generator of the second clocking signal fb2. This matching is checked by displaying the phase on the indicator, consisting of light-emitting diodes, connected to the output of the comparator 134. This matching is not essential as the device permits a relative deviation of plus or minus $10^{-8}$. The positioning of the dividers 330, 340, 35 at their minimum value so as to initialize the time constant $\tau$ of the automatic locking means 3 at its minimum initial value $\tau$ is also achieved. The system also makes it possible to initialize the counting variables A, B, C, these variables being defined as follows:

A: the order of the measuring sequence for measuring the value of n, representing the frequency or phase deviation between the first and second intermediate frequency signals, a measuring sequence corresponding to the time interval between two pulses for writing the value n in the buffer memory 370, B: the order of the measuring sequence for measuring the value n for which the phase shift $\phi$ ranges between the phase shift values $\phi m1$ and $\phi m2$, C: the parameter defining the current value of the time constant, in seconds, of $\tau j$ of the automatic locking defined by $\tau j = 25 \times 2^C$.

When the starter button is released, the dividers by N become active, the signal B1 goes to the value 1 through the first descending edge of the intermediate frequency f2 signal, then to B2 through the first descending edge of the intermediate frequency f1 signal, or conversely according to the phase between the clocking signals fb1 and fb2. The counting and countdown then take place. After N periods, there is a re-positioning of the programmable dividers, a loading of the contents of the counting/countdown device 366 in the buffer memory 370, a variation in the analog control voltage Af applied to the control input 10 of the quartz oscillator 1.

After the above-described starting up step 1000 and initializing step 1001, the program then comprises, as shown in FIG. 4, a testing stage 1002 for testing the phase shift value $\phi$ between the first and second clocking signals, fb1 and fb2, with respect to the two phase threshold values $\phi m1$, $\phi m2$, said test constituting a phase capture test. A negative response to the phase capture test 1002 enables the execution, after the incrementation of the counter A, of a new measuring sequence by returning to the situation prior to the test at the phase 1002, whereas a positive response to the above-mentioned test enable a passage to a stage for checking the capture of the automatic phase locking. In the event of a positive response to the phase capture test 1002, a step 1004 for incrementing the parameters A and B enables the passage to a successive measurement and a test 1005 for phase stabilization on the number No of measurements for which the phase capture test 1002 is satisfied. A negative response to the phase stabilization test 1005 enables a return to a fresh measurements condition prior to the test 1002. Upon a positive response to the phase stabilization test 1005, there is provision for a step 1006 for incrementing the division ratios N and M of the first and second counting means, 33 and 34, of the clock signal fh generators 35. The incrementing step is marked 1006. This step 1006 is followed by a step 1007 for re-initializing the parameters A and B. The re-iniializing step 1007 is itself followed by a testing step 1008 for comparing C, representing the value of the current automatic lock constant $\tau j$ with the final value D which the operator introduces by encoding. A negative response to the test 1008 leads to a step for the incrementation of C and then to a return to a phase measuring step prior to the phase comparing test 1002, and a positive response to the test 1008 leads to a fresh test 1010 for comparing the phase value $\phi$ with the phase threshold values $\phi$m1 and $\phi$m2. A positive response to the phase comparison test 1010 leads to a new test step 1010, the system being automatically locked, and a negative response to the test 1010 leads to a step 1012 for decrementing the parameter C, so that the system is returned to the prior situation, the time constant value of the automatic locking means 3 being brought to the value $\tau j-1=\tau j-1=25\times 2^{C-1}$. The system is the value j-1=then brought, after the decrementation stage 1012, to a phase-measuring stage prior to the test situation 1002.

In practice, it will be observed that the initializing or zero-setting pulse delivered by the circuit 367 to the buffer memory 370 enables, in particular, either the incrementation of both counters A and B, at the step 1004 if the phase $\phi$ between the clocking signal fb1 and the clocking signal fb2 is between the two comparator-set limits $\phi$m1 and $\phi$m2, $\phi$m1 and $\phi$m2 being taken as equal, for example, to 90−$\epsilon$ and $\phi$m2 being taken as equal to 90°+$\epsilon$, or the incrementation of the single counter A at 1003, if the phase $\phi$ is outside this range.

The test A=B=3 at 1005 means that, in three successive measurements, the phase $\phi$ has stayed within the fixed limits om1, om2: this phase is then considered as stabilized.

The pulse delivered by the circuit 361, constituting a control pulse for loading the buffer memory 370, also controls the changing of the division factors of the dividers by N and M, the programmable dividers 330, 340 and 35 respectively. This command can be given by any means, in particular through the microprocessor which can directly control the programmable dividers. These dividers then go to the values N and M respectively. The counting variable C is compared with the value D indicated by the operator on the encoding wheels. If C is smaller than D, the counters A and B being zero-set, the process is resumed in order to perform measurements on 2N periods. If the phase remains within the fixed range for three measurements, C is incremented until C=D. The system remains in this state for as long as $\phi$ remains within the permitted range. Otherwise an alarm is triggered by the closing of a relay and a fault, memorized by the flip-flop, is displayed through the light-emitting diode as explained earlier.

If the system gets unlocked, it means that the time constant chosen is too high and it suffices to reduce the value D of the encoding wheel.

Figure 5:
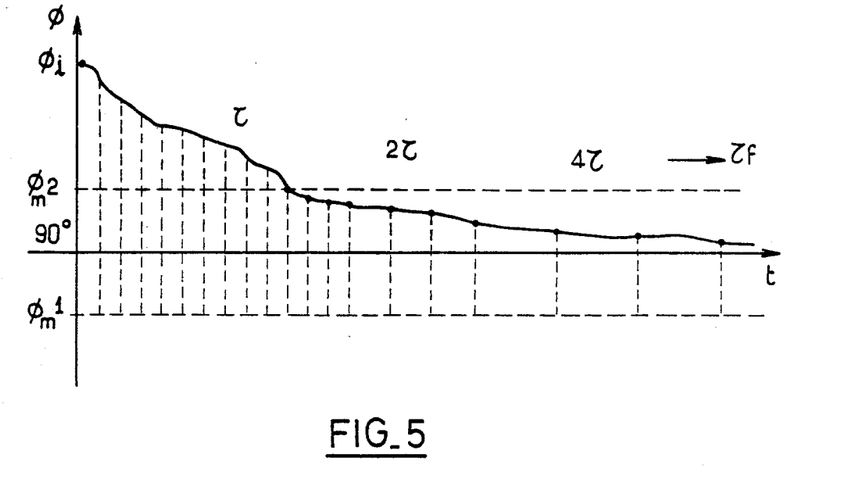
FIG. 5 shows a diagram illustrating the development of the phase shift $\phi$ between the clocking signals fb1 and fb2 during the capture of the automatic locking means course 3 in the course of time, the time constant of these means being successively incremented to reach the final value $\tau f$ according to the flow chart shown in FIG. 4.

FIG. 5 shows a schematic and illustrative view of the convergence relationship of the phase $\phi$ as a function of time, for an automatic locking time constant $\tau$, 2$\tau$, 4$\tau$. The time constant is thus incremented after three successive measurements showing that the phase value is within the set range consisting of the values $\phi$m1, $\phi$m2.

The automatic lock, as shown in FIG. 3, thus gives a phase convergence relationship of between the clocking signal fb1 and the clocking signal fb2 optimized inasmuch as the convergence time with respect to a usual system is substantially divided by two. Furthermore, in view of the variation range of the time constant i, the device of the invention provides great flexibility of use, said device of the invention constituting a short-term and long-term reference possessing stability, between 1 and 1000 s, equal to that of a freely oscillating quartz oscillator and possessing the stability of caesium clocks for long-term measurements.

A prototype of this device has been made and comparative tests between a quartz oscillator and a hydrogen maser have shown satisfactory stability characteristics, defined on the basis of Allan's variance, as compared with the hydrogen masers.

In addition to the above-mentioned applications, the clocking device with substantially constant stability of the invention, for short-term and long-term time measurement, can be advantageously used in scientific and operational metrology, in geodesics, for location and navigation and for the synchronization of telecommunications networks.

Similarly, the device of the invention can be used in the aerospace industry for the synchronization of microwave signals propagated from space to earth or from earth to space.

This last application is possible because the device of the invention preserves the spectral properties of the automatically controlled oscillator, namely the quartz oscillator, and especially the signal-to-noise properties of this oscillator.

What is claimed is:

1. A clocking device of substantially constant stability for the short-term and long-term measurement of time comprising:
   first generating means of a first clocking signal with substantially constant stability for short-term time measurement,
   second generating means of a second clocking signal of substantially constant stability for long-term time measurement,
   means for the automatic locking of one of the said first or second clocking signals to the other, second or first, clocking signal, said first and second clocking signal having the same base frequency or harmonic frequencies, said automatic locking means having a time constant corresponding to the transition zone between the short-term and long-term measurements.

2. A device according to claim 1 wherein said first generating means of the first clocking signal are constituted by a highly stable quartz oscillator.

3. A device according to claim 1 wherein said second generating means of the second clocking signal are constituted by a caesium clock.

4. A device according to claim 2 wherein said means for the automatic locking of one of said first or second clocking signals to the other, second or first, clocking signal achieves the automatic locking of said first clocking signal to said second clocking signal, said first generating means of the first clocking signal consisting of an adjustable frequency quartz oscillator having a control input.

5. A device according to claim 4 wherein said automatic locking means comprise:
   first means for changing the frequency of the first clocking signal,
   second means for changing the frequency of the second clocking signal,
   means 30 for generating a local oscillator reference signal enabling the creation and delivering of a local oscillator signal with a frequency foL, common to said first and second frequency changing means, said first and second frequency changing means delivering a first and second intermediate frequency signal, with respective frequencies fl and f2, each representing the frequency and phase of the said first and second clocking signals respectively, first and second means for counting a number N of periods of said first and second intermediate frequency signals respectively, of frequencies f1, f2, giving logic signals, B1, B2, representing the counting of N periods of the first and second intermediate frequency signals, for means for generating a clock signal, the frequency of which is a harmonic frequency of the frequency of the first clocking signal, count/countdown means used to establish a value n representing the frequency or phase deviation of the first intermediate frequency signal with respect to the second intermediate frequency signal, the counting or countdown being done with respect to the clock signal, means for generating an analog signal representing the frequency and phase deviation between the first and second intermediate frequency signals, said generating means delivering said analog signal to said control input of the adjustable frequency quartz oscillator.

6. A device according to claim 5 wherein said means for generating a local oscillator signal are automatically locked in phase with said second clocking signal.

7. A device according to claim 6 wherein said means for generating a local oscillator signal are constituted by a frequency synthesizer, the frequency of the second intermediate frequency signal being close to 10 Hz.

8. A device according to claim 5 wherein, in order to automatically lock the frequency of the first clocking signal with that of the second clocking signal, said count/countdown means comprise:

a logic circuit for the preparation of the logic signals B1.B2 and B2.B1, the logic product of the signals B1 and B2 and B2 and B1 respectively.

a first and second OR gate, each receiving the clock signal and the signals B1.B2 and B2.B1 respectively, a count/countdown unit receiving, at the counting input, the logic signal delivered by the second OR gate and at the countdown input the signal delivered by the first OR gate, a circuit generating pulses at the end of the counting of N periods, delivering at the end of the counting of N periods of the first and second intermediate frequency signals, a re-initializing or zero-setting pulse, said means for generating an analog signal consisting of a buffer memory and a digital/analog converter.

9. A device according to claim 8 wherein, in order to further provide for automatic phase locking of the first clocking signal with the second clocking signal, said count/countdown means further comprise:

a clock frequency fh signal duplicating circuit used to create a first and second duplicated clock signal of different frequencies, means to discriminate a period, among p, of the second signal, said means delivering a determined logic state signal throughout the duration of said pth period thus discriminated, means for the counting, during the said pth period, of a number $n\phi$ of periods of each of said first and second duplicated clock signals so as to give a first and second phase setting signal, said first phase setting signal $\phi 1$ being delivered to the input of the second OR gate and the phase setting signal $\phi 2$ being delivered to the input of the first OR gate.

10. A device according to claim 5 wherein, in order to implement automatic locking means with sequentially variable time constant, said first and second counting means and said means for generating the clock signal comprise a programmable frequency divider with its input gate connected to a control circuit.

11. A device according to claim 10 wherein, in order to provide for the control of the time constant of said automatic locking means according to a determined variation sequence, said control circuit consists of a control logic circuit or a microprocessor.

12. A device according to claim 10 wherein, in order to provide for the control of the time constant of said automatic locking means according to a determined variation sequence, said automatic locking means further comprise:

third frequency changing means receiving, firstly, said first clocking signal and second clocking signal to deliver a beat signal fB, the amplitude of which is proportionate to the phase $\phi$ of said first clocking signal with respect to said second clocking signal, said clocking signals being automatically locked in frequency, amplifier means used to obtain an amplified beat signal fB, comparator means with a dual phase value threshold, $\phi m1$ and $\phi m2$, said comparator giving a two-state logic signal, a first state corresponding to a phase $\phi$ value ranging between said phase threshold values, $\phi m1$ and $\phi m2$, and a second state, complemented with respect to the first state, corresponding to a phase value external to the phase interval defined by the phase threshold values, $\phi m1$ and $\phi m2$, said logic signal being delivered to an input gate of said control circuit to enable an automatic locking of said phase value $\phi$ between the two said phase threshold values, $\phi m1$ and $\phi m2$.

13. A device according to claim 12 wherein said control circuit comprises a system for the encoding, by the operator using the device, of the final value $\tau f$ of the final time constant of the automatic locking means, said control circuit being used to obtain, from the initial phase shift value $\phi i$ between said first and second clocking signals, an optimal convergence of the capture of the automatic locking through sequential modification of the value of the time constant $\tau j$ to reach the final value $\tau f$, the phase shift value $\phi$ being held in the interval defined by the phase threshold values $\phi m1$ and $\phi m2$.

14. A device according to claim 11 wherein said control circuit being constituted by a microprocessor, said microprocessor comprises an associated read-only memory in which a program is implanted to control the sequential variation of the division ratio N of the first and second counting means of a number N of periods of the first and second intermediate frequency signals, of frequencies f1 and f2 respectively, and of the division ratio M of the generating means of the clock signal fh.

15. A device according to claim 14 wherein said program comprises:

a starting up and initializing step triggered by the operator when the device is turned on through the control device, said initializing step comprising, in particular:

* the setting at 1 of the most significant bit of the count/countdown unit, the other bits being set at zero,
* the positioning of the dividers 330, 340, 35 at their minimum value so as to initialize the time constant $\tau$ of the automatic locking means at its minimum initial value $\tau i$,
* the initializing of the counting variables A, B, C, said variables being defined as:

A: the order of the sequence to measure the value of n representing the frequency or phase deviation between the first and second intermediate frequency signals, temporal sequence corresponding to the time interval between two pulses for writing said value n in the buffer memory, B: the order of the sequence to measure the value of n for which the phase shift $\phi$ ranges between the phase shift threshold values $\phi m1$ and $\phi m2$, C: the parameter for defining the current value of the automatic locking time constant, in seconds, ij defined by: $\tau j = 25 \times 2^C$, a step for testing the phase shift value $\phi$ between the first and second clocking signals and the two phase threshold values $\phi m1$, $\phi m2$, a phase capture test, a negative response to said test enabling, after incrementation of the parameter A, the execution of a fresh measuring sequence by a return to the situation prior to the test on the phase, a positive response to said test enabling the passage to a step for checking the capture of the automatic phase lock, a step for incrementing said parameters A and B, enabling the passage to a successive measurement and to a phase stabilizing test on the number $n\phi$ of measurements for which the phase capture test is satisfactory, a negative response to the test enabling a return to a fresh measuring situation prior to the test, a step for incrementing the division ratios N and M of the first and second counting means and clock signal generating means upon a positive response to the phase stabilizing test, a step for re-initializing the parameters A and B, a step for testing the comparison of C, representing the value of the current time constant $\tau j$ of the automatic locking, with the final value D introduced by encoding by the operator, a negative response to said test leading to a step for the incrementation of C and then to a return to a phase measuring step prior to the phase comparison test, and a positive response to said test leading to a fresh test for comparing the phase value $\phi$ with the phase threshold values, $\phi m1$ and $\phi m2$, a positive response to said test leading to a new test step, the system being automatically locked, and a negative response to said test leading to a step for the decrementation of the parameter C so as to return to the prior situation, the value of the time constant of the automatic locking means being brought to the value $\tau j-1 = 25 \times 2^{C-1}$ and the system being brought back, after said decrementation, to a phase measuring step prior to the test situation.

16. A device according to claim 6 wherein, in order to automatically lock the frequency of the first clocking signal with that of the second clocking signal, said count/countdown means comprise:

a logic circuit for the preparation of the logic signals B1.B2 and B2.B1, the logic product of the signals B1 and B2 and B2 and B1 respectively, a first and second OR gate, each receiving the clock signal and the signals B1.B2 and B2.B1 respectively, a count/countdown unit receiving, at the counting input, the logic signal delivered by the second OR gate and at the countdown input the signal delivered by the first OR gate, a circuit generating pulses at the end of the counting of N periods, delivering at the end of the counting of N periods of the first and second intermediate frequency signals, a re-initializing or zero-setting pulse, said means for generating an analog signal consisting of a buffer memory and a digital/analog converter.

17. A device according to claim 7 wherein, in order to automatically lock the frequency of the first clocking signal with that of the second clocking signal, said count/countdown means comprise:

a logic circuit for the preparation of the logic signals B1.B2 and B2.B1, the logic product of the signals B1 and B2 and B2 and B1 respectively, a first and second OR gate, each receiving the clock signal and the signals B1.B2 and B2.B1 respectively, a count/countdown unit receiving, at the counting input, the logic signal delivered by the second OR gate and at the countdown input the signal delivered by the first OR gate, a circuit generating pulses at the end of the counting of N periods, delivering at the end of the counting of N periods of the first and second intermediate frequency signals, a re-initializing or zero-setting pulse, said means for generating an analog signal consisting of a buffer memory and a digital/analog converter.

* * * * *